(12) United States Patent
Hu

(10) Patent No.: US 7,397,402 B1
(45) Date of Patent: Jul. 8, 2008

(54) METHOD AND SYSTEM FOR PROVIDING ARITHMETIC CODE NORMALIZATION AND BYTE CONSTRUCTION

(75) Inventor: Yendo Hu, La Jolla, CA (US)

(73) Assignee: General Instrument Corporation, Horsham, PA (US)

( * ) Notice: Subject to any disclaimer, the term of this patent is extended or adjusted under 35 U.S.C. 154(b) by 0 days.

(21) Appl. No.: 11/625,417

(22) Filed: Jan. 22, 2007

(51) Int. Cl.
*H03M 7/00* (2006.01)
(52) U.S. Cl. .................. 341/107; 341/50
(58) Field of Classification Search .......... 341/50, 341/67, 107, 65; 712/300
See application file for complete search history.

(56) References Cited

U.S. PATENT DOCUMENTS

| | | | | |
|---|---|---|---|---|
| 5,111,415 A | * | 5/1992 | Shackleford | 708/205 |
| 5,751,233 A | * | 5/1998 | Tateno et al. | 341/67 |
| 5,798,953 A | * | 8/1998 | Lozano | 708/211 |
| 6,970,114 B2 | * | 11/2005 | Lovell | 341/100 |
| 7,286,066 B1 | * | 10/2007 | Ho et al. | 341/67 |

* cited by examiner

*Primary Examiner*—Peguy JeanPierre
(74) *Attorney, Agent, or Firm*—Benjamin D. Driscoll

(57) ABSTRACT

A method and system are provided for code normalization and byte construction. A plurality of subsets of bits is extracted from a first input. Each of the subsets of bits has a bit width equaling a number of leading zeros from a second input variable. Further, a consecutive sequence of the plurality of subsets is stored in a memory. In addition, the consecutive sequence of the plurality of subsets is read from the memory if a third input release flag is established.

20 Claims, 7 Drawing Sheets

METHOD AND SYSTEM FOR PROVIDING ARITHMETIC CODE NORMALIZATION AND BYTE CONSTRUCTION

BACKGROUND

1. Field

This disclosure generally relates to the field of video data processing. More particularly, the disclosure relates to Context Adaptive Binary Arithmetic Coding ("CABAC") for digital video encoders.

2. General Background

Video signals generally include data corresponding to one or more video frames. Each video frame is composed of an array of picture elements, which are called pixels. A typical color video frame having a standard resolution may be composed of over several hundreds of thousands of pixels, which are arranged in arrays of blocks. Each pixel is characterized by pixel data indicative of a hue (predominant color), saturation (color intensity), and luminance (color brightness). The hue and saturation characteristics may be referred to as the chrominance. Accordingly, the pixel data includes chrominance and luminance. Therefore, the pixel data may be represented by groups of four luminance pixel blocks and two chrominance pixel blocks. These groups are called macroblocks ("MBs"). As a video frame generally includes many pixels, the video frame also includes a large number of MBs. Thus, digital signals representing a sequence of video frame data, which usually include many video frames, have a large number of bits. However, the available storage space and bandwidth for transmitting these digital signals is limited. Therefore, compression processes are used to more efficiently transmit or store video data.

Compression of digital video signals for transmission or for storage has become widely practiced in a variety of contexts. For example, multimedia environments for video conferencing, video games, Internet image transmissions, digital TV, and the like utilize compression. Coding and decoding are accomplished with coding processors. Examples of such coding processors include general computers, special hardware, multimedia boards, or other suitable processing devices. Further, the coding processors may utilize one of a variety of coding techniques, such as variable length coding ("VLC"), fixed coding, Huffman coding, blocks of symbols coding, and arithmetic coding. An example of arithmetic coding is Context Adaptive Binary Arithmetic Coding ("CABAC").

CABAC techniques are capable of losslessly compressing syntax elements in a video stream using the probabilities of syntax elements in a given context. The CABAC process will take in syntax elements representing all elements within a macroblock. Further, the CABAC process constructs a compress bit sequence by building out the following structure: the sequential set of fields for the macroblock based on the chosen macroblock configuration, the specific syntax element type and value for each of the fields within this field sequence, and the context address for each of the syntax elements. The CABAC process will then perform binarization of the syntax elements, update the context weights, arithmetically encode the binarizations of syntax elements ("bins"), and subsequently pack the bits into bytes through the syntax element processing component.

The components of the CABAC process include: the CABAC weight initialization mode selection module, the macroblock syntax sequence generator, the binarization engine, the context address generator, the context weight update engine, the arithmetic coder, the bit packetizer, and the Network Abstraction Layer ("NAL") header generator. The CABAC engine within a video encoder may accomplish two goals within the encoding process: (1) to carry out compressed data resource prediction for mode decision purposes; and (2) to losslessly compress the data for signal output delivery. The compressed data resource prediction task predicts the amount of bits required given a set of specific encoding modes for a given macroblock. Potential mode decision implementations may have up to eight modes to select from. The computational demand on the CABAC engine to support the mode decision task is significant.

The weight update, arithmetic encoder and the bit packing components of the CABAC engine may require a significant amount of non-trivial computational and processing resources in a sequential processor implementation. Given that high performance encoding systems require multiple macro block rate distortion iterations of encoding per macro block, the CABAC process may impose an unreasonable resource demand on a processor-based solution. Prior implementations typically compromise on mode decision CABAC resource estimation accuracy by limiting the CABAC to bin level accuracy.

A system capable of processing one binary symbol per clock cycle requires a matching back end-receiving engine capable of also processing the results on every cycle. The back end tasks consist of a value normalization task, which may generate up to eight bits of data, and a bit packing task, which groups the bits into bytes. The implementation solutions for the normalization and bit packing tasks are complex and computationally demanding.

Current implementations of the normalization function for the CABAC arithmetic coder fall into two categories. The first category includes routines that can generate at most one bit per cycle. This approach may utilize up to eight cycles to process one binary symbol as a single binary symbol may generate up to eight bits. The second category includes routines that achieve single cycle per binary symbol using a method that does not optimally handle all cases of the carry from the input data and the adder.

SUMMARY

In one aspect of the disclosure, a process extracts a plurality of subsets of bits from a first input. Each of the subsets of bits has a bit width equaling a number of leading zeros from a second input variable. Further, the process stores, in a memory, a consecutive sequence of the plurality of subsets. In addition, the process reads the consecutive sequence of the plurality of subsets from the memory if a third input release flag is established.

In another aspect, a process stores a consecutive set of variable bit width data into a first in first out buffer. The variable bit width data has a width that is determined by a number of leading zeroes from an input variable. Further, the process reads the data from the first in first out buffer if the receiving data contains only ones.

In yet another aspect, a process stores a consecutive set of data from a first input variable into a memory. Further, the process receives a subsequent data set from the first input variable. In addition, the process reads the consecutive set of data from the memory if the subsequent data set includes one or more binary bits having a value of zero.

BRIEF DESCRIPTION OF THE DRAWINGS

The above-mentioned features of the present disclosure will become more apparent with reference to the following description taken in conjunction with the accompanying drawings wherein like reference numerals denote like elements and in which.

DETAILED DESCRIPTION

A method and system are disclosed, which provide an improved video digital data compression capable of providing a single cycle normalization for real-time digital video encoders, such as an MPEG-4 or an H-264 series encoder. The method and system may be utilized by the back end processor within the arithmetic encoder. As a result, normalization and payload to byte packing may be accomplished.

Figure 1:
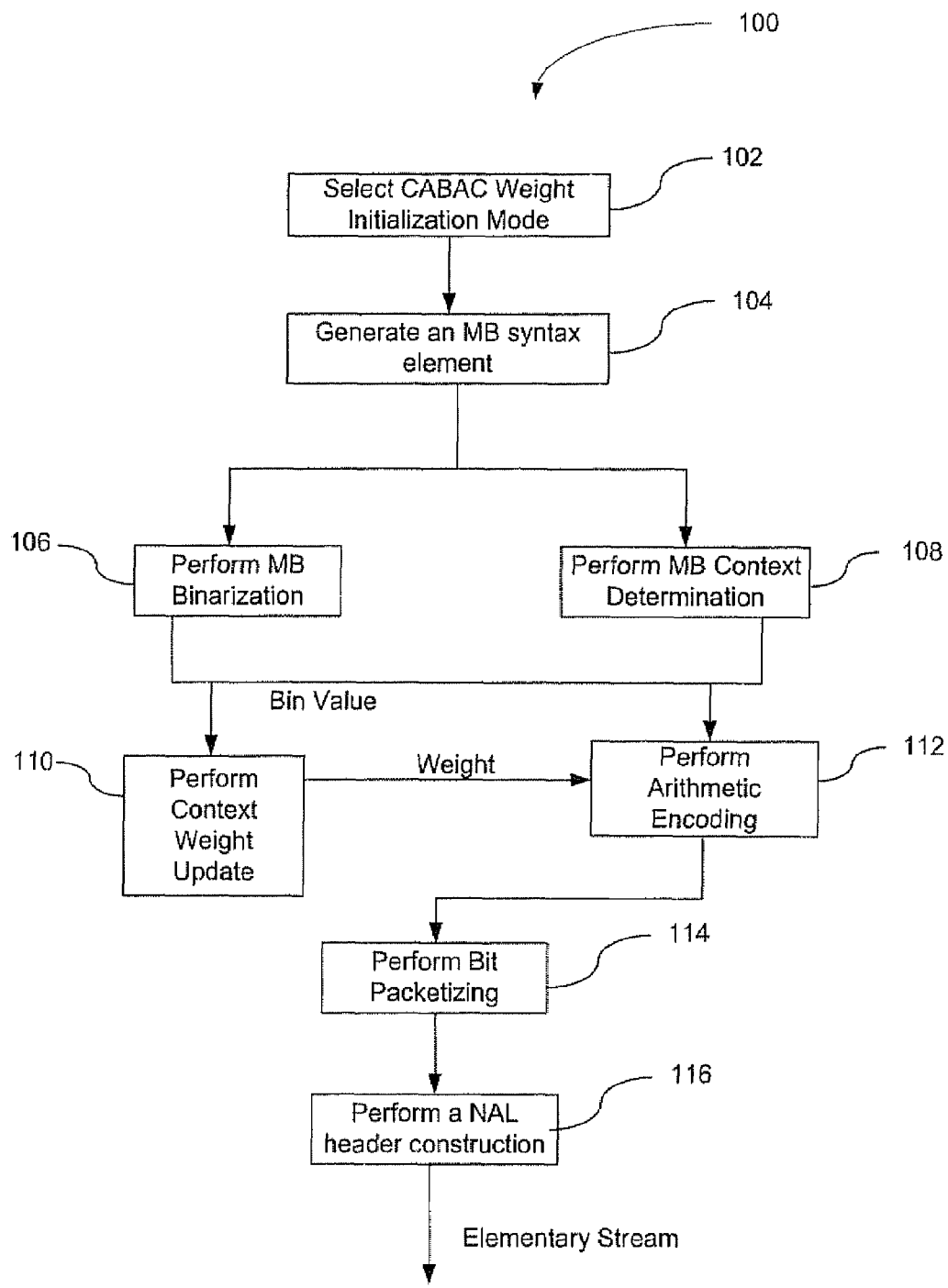
FIG. 1 illustrates a CABAC process.

FIG. 1 illustrates a CABAC process 100. At a process block 102, the CABAC process 100 selects a CABAC weight initialization mode. Further, at a process block 104, the CABAC process 100 generates an MB syntax sequence. In addition, at a process block 106, the CABAC process 106 converts a syntax to binary. The term binarization may be utilized to denote the process block 106. Further, at a process block 108, the CABAC process 100 performs a context address determination. The term ctxIdx generation may be utilized to denote the process block 108. At a process block 110, the CABAC process 100 performs a context weight update. Further, at a process block 112, the CABAC process 100 performs an arithmetic encoding. In addition, at a process block 114, the CABAC process 100 performs a bit packetizing. Finally, at a process block 116, the CABAC process 100 performs a NAL header construction. An elementary stream results from the CABAC process 100.

Figure 2:
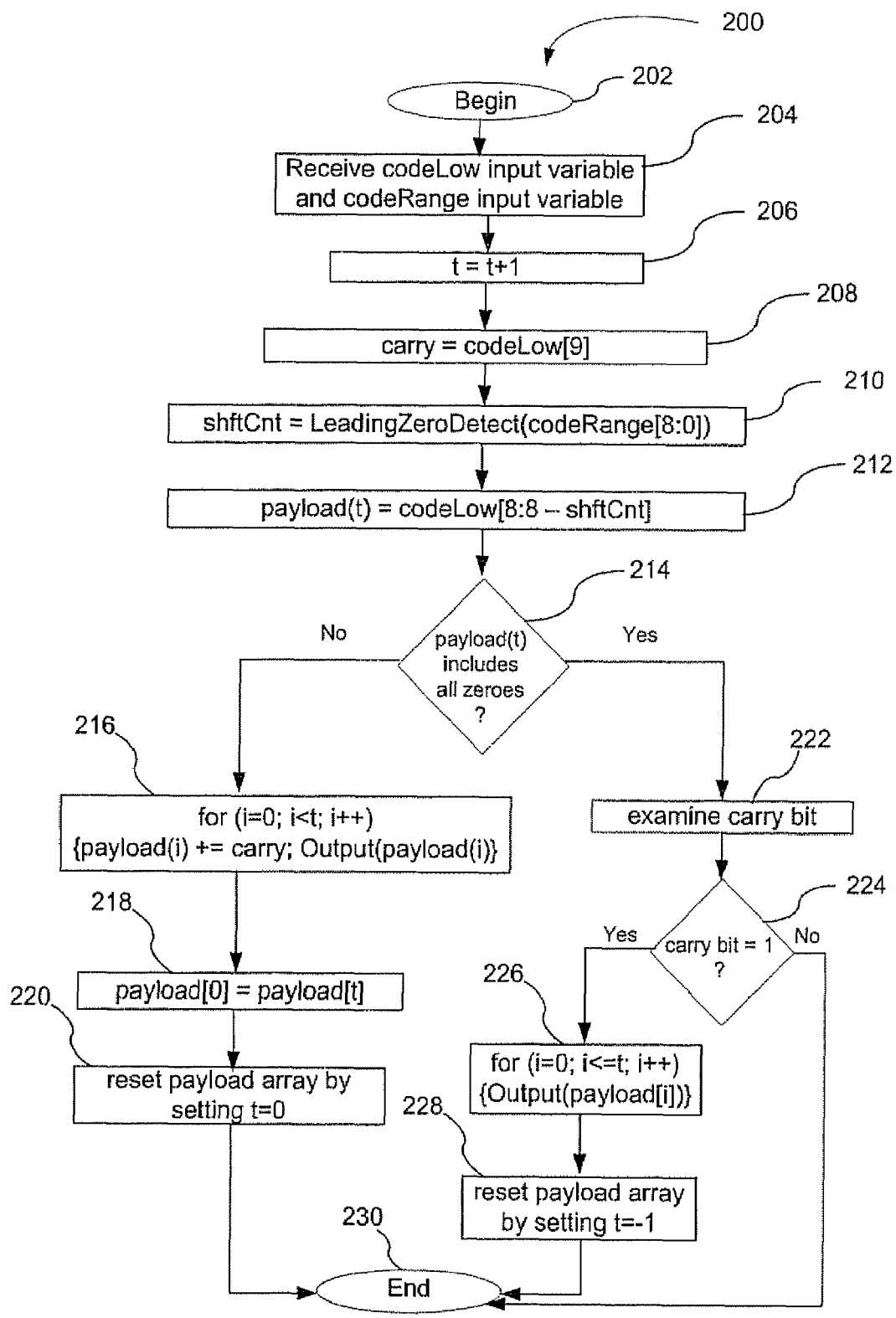
FIG. 2 illustrates an arithmetic coder normalization process.

FIG. 2 illustrates an arithmetic coder normalization process 200. In one embodiment, the arithmetic coder normalization process 200 can be utilized for the MPEG4 standard to process data at the bit level. The arithmetic coder normalization process 200 may utilize up to eight loop iterations to process a single binary input symbol from the front end arithmetic coder. Accordingly, an upper bound is placed on the computational demand. The arithmetic coder normalization process begins at a process block 202. Further, at a process block 204, the arithmetic coder normalization process 200 receives a codeLow input variable and a codeRange input variable. In one embodiment, the codeLow input variable includes ten bits and the codeRange input variable includes nine bits. Further, at a process block 206, the arithmetic coder normalization process 200 increments an internal index. For example, the arithmetic coder normalization process 200 may increment an internal index "t" by one. In addition, at a process block 208, the arithmetic coder normalization process 200 extracts the most significant bit from the codeLow input variable for a carry bit. At a process block 210, the arithmetic coder normalization process 200 sets a variable to hold the number of leading zeros of the codeRange input variable. For example, the variable may be entitled shftCnt. Further, at a next process block 212, the arithmetic coder normalization process 200 extracts a block of bits from the codeLow input variable. This is accomplished by discarding the most significant bits of the codeLow input variable and removing all the leading zeros to form a variable bit width block of bits. The variable bit width block of bits is then stored in a payload array at location t, which may be referred to by the variable payload[t].

At a decision block 214, the arithmetic coder normalization process 200 determines if the contents of the variable payload [t], i.e., the bits, include only ones or both ones and zeroes. If the variable payload(t) includes both ones and zeroes, the arithmetic coder normalization process 200 proceeds to a process block 216. At the process block 216, the arithmetic coder normalization process begins with the first entry of the payload array. A carry is added to the first entry in the payload array. The payload is then outputted without the resulting carry. The arithmetic coder normalization process 200 then adds the carry from the addition of the first entry in the payload array to the second entry in the payload array. The payload is then outputted without the resulting carry. The arithmetic coder normalization process 200 works through the entries payload array in a similar manner until the entry in payload(t−1) is processed. The iterations through these entries in the payload array may be denoted by the following code: for (i=0; i<t; i++ ) {payload[i] += carry; Output(payload[i])}. Once the entry in payload[t−1] is processed, the arithmetic coder normalization process 200 proceeds to a process block 218 where the most recent payload is moved to the base of the array, which may be denoted by payload[0] = payload[t]. The arithmetic coder normalization process 200 then proceeds to a process block 220 to reset the payload array by setting the variable t to zero. The arithmetic coder normalization process 200 then ends at a process block 230.

If the arithmetic coder normalization process 200 determines, at the decision block 212, that the contents of the variable payload[t] include only ones, the arithmetic coder normalization process proceeds from the decision block 212 to the process block 222. At the process block 222, the carry bit is examined. The arithmetic coder normalization process 200 then proceeds to a decision block 224 to determine if the input carry bit equals one. If the arithmetic coder normalization process 200 determines that the input carry bit equals one, the arithmetic coder normalization process 200 proceeds to a process block 226. At the process block 226, the arithmetic coder normalization process 200 outputs all payload entries from index zero to index t sequentially beginning with the index zero. This approach can be denoted by the following code: for (i=0; i<=t; i++ ) {Output(payload[i])}. The arithmetic coder normalization process 200 then proceeds to a process block 228. At the process block 228, the arithmetic coder normalization process 200 resets the index to negative one. The arithmetic coder normalization process 200 then ends at a process block 230.

If the arithmetic coder normalization process 200 determines, at the decision block 224, that the input carry bit does not equal one, the arithmetic coder normalization process 200 ends at the process block 230.

Figure 3:
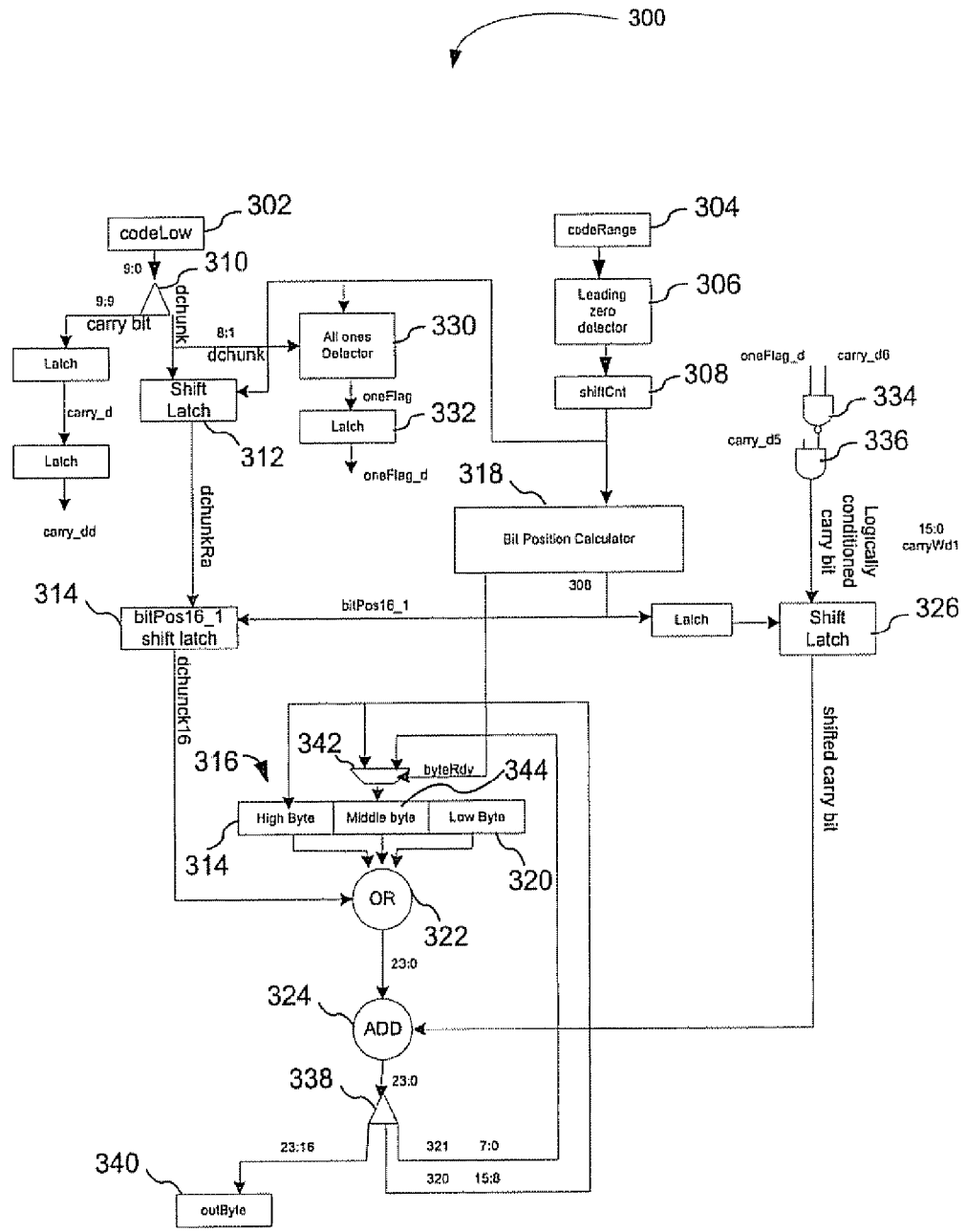
FIG. 3 illustrates an arithmetic coder normalization process that can process a new input data on every clock cycle.

FIG. 3 illustrates a normalization and bit packing engine 300 capable of receiving one codeLow input and one code range input per cycle. This approach is based on binarization of syntax element ("bin") level processing. In one embodiment, a hardware solution is capable of providing a normalization and bit packing to bytes operation. This approach significantly reduces the hardware resources utilized by current systems. Specifically, this approach utilizes logic instead of memory lookup tables to resolve decision making tasks.

The normalization and bit packing engine 300 receives two distinct variables: a codeLow variable 302 and a codeRange variable 304, on every clock cycle. A leading zero detector 306 generates an output that is equal to the number of leading zero binary bits in the codeRange variable 304. This output is registered in a latch shiftCnt 308. A bus splitter 310 outputs a carry bit and a dchunk variable. The carry bit is extracted from the most significant bit of the codeLow variable 302. Further, the dchunk variable, which includes the second through ninth lower bits of the codeLow variable 302, is then shifted right by shiftCnt variable 308 through a shift latch 312. The output dchunkRa of this shift latch 312 is then further shifted by bitPos16_1 variable through a bitPos16_1 shift latch 314 to align the data to fit into an output preparation register 316. The output preparation register 316 is utilized to hold data until there are enough output bits to form a full byte. In another embodiment, a plurality of output preparation registers 316 may be utilized.

A bit position calculator 318 generates a bitPos16_1 variable and a byte ready flag based on the input to the shiftCnt variable. The bitPos16_1 variable identifies where the dchunkR should reside within the output preparation register 316. The byte ready flag identifies when the least significant byte 320 is ready for output. The bitPos16_1 shift latch 314 outputs dchunk16, which is then sent to a logical or gate 322 along with the output from the output preparation register 316. The output from the logical or gate 322 is then sent to an adder 324 along with a shifted carry bit from a shift latch 326 to form both the output byte 328 and the new data for the output preparation register 316. The shifted carry bit is generated by the shift latch 326, which shifts the logically conditioned carry bit utilizing oneFlag_d, a delayed carry flag carry_d6, and a delayed carry flag carry_d5.

The oneFlag_d is generated by first providing dchunk to an all ones detector 330. If dchunk is all ones, the all ones detector 330 outputs oneFlag and provides oneFlag to a latch 332. The latch 332 shifts oneFlag and outputs oneFlag_d.

The oneFlag_d is provided along with a delayed carry flag carry_d6 to a first gate 330. Further, the output of the first gate 334 is provided along with a delayed carry flag carry_d5 to a second gate 336.

The output of the adder 324 is split into a plurality of bytes through a bit splitter 338. In one embodiment, the bit splitter 338 splits the output of the adder 324 into three bytes. Further, in one embodiment, the bit splitter 338 is a twenty four bit splitter. The most significant byte is provided to an output byte register 340, which may be denoted by the term outByte. The two least significant bytes are routed through a multiplexor 342 to feed the inputs of the output preparation register 316. Based on the byteRdy flag, the multiplexor 342 selects one of the two lower output bytes from the adder 324 for the middle byte 344 of the output preparation register 316.

Figure 4:
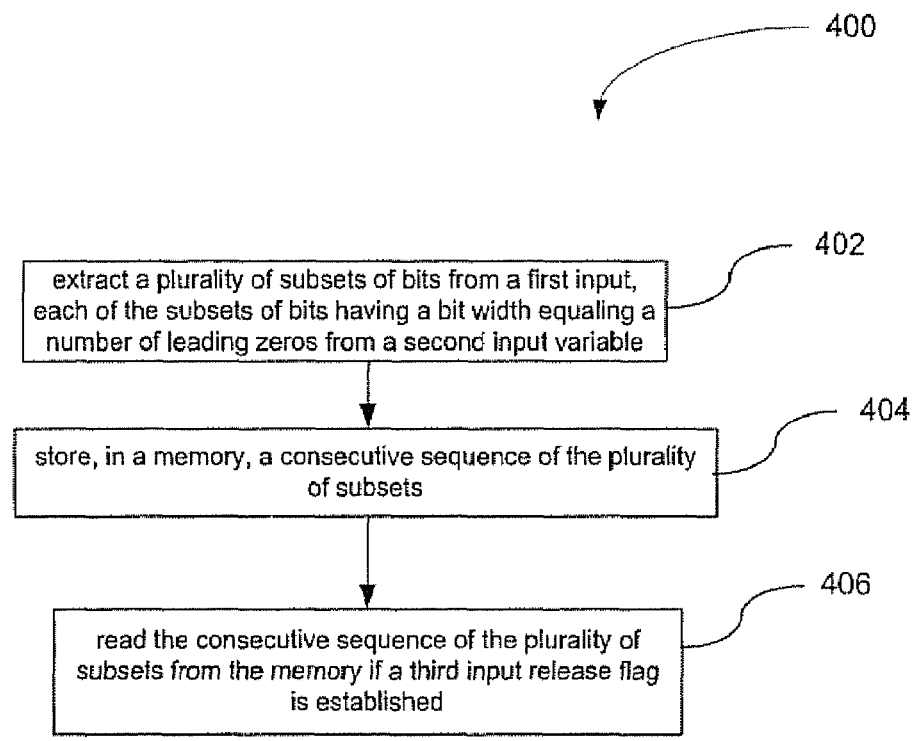
FIG. 4 illustrates a process for code normalization and byte construction.

FIG. 4 illustrates a process 400 for code normalization and byte construction. At a process block 402, the process 400 extracts a plurality of subsets of bits from a first input. Each of the subsets of bits has a bit width equaling a number of leading zeros from a second input variable. Further, at a next process block 404, the process 400 stores, in a memory, a consecutive sequence of the plurality of subsets. In addition, at a process block 406, the process 400 reads the consecutive sequence of the plurality of subsets from the memory if a third input release flag is established.

Figure 5:
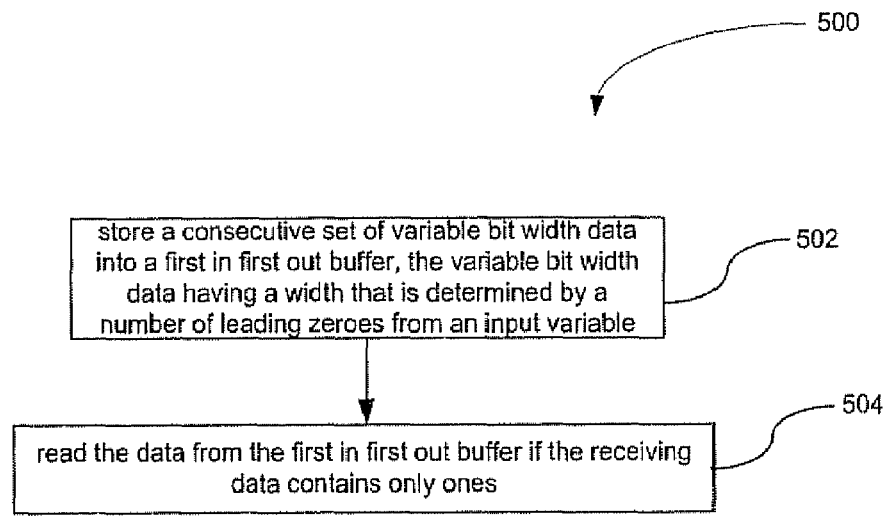
FIG. 5 illustrates another process for code normalization and byte construction.

FIG. 5 illustrates another process 500 for code normalization and byte construction. At a process block 502, the process 500 stores a consecutive set of variable bit width data into a first in first out buffer. The variable bit width data has a width that is determined by a number of leading zeroes from an input variable. Further, at a process block 504, the process 500 reads the data from the first in first out buffer if the receiving data contains only ones.

Figure 6:
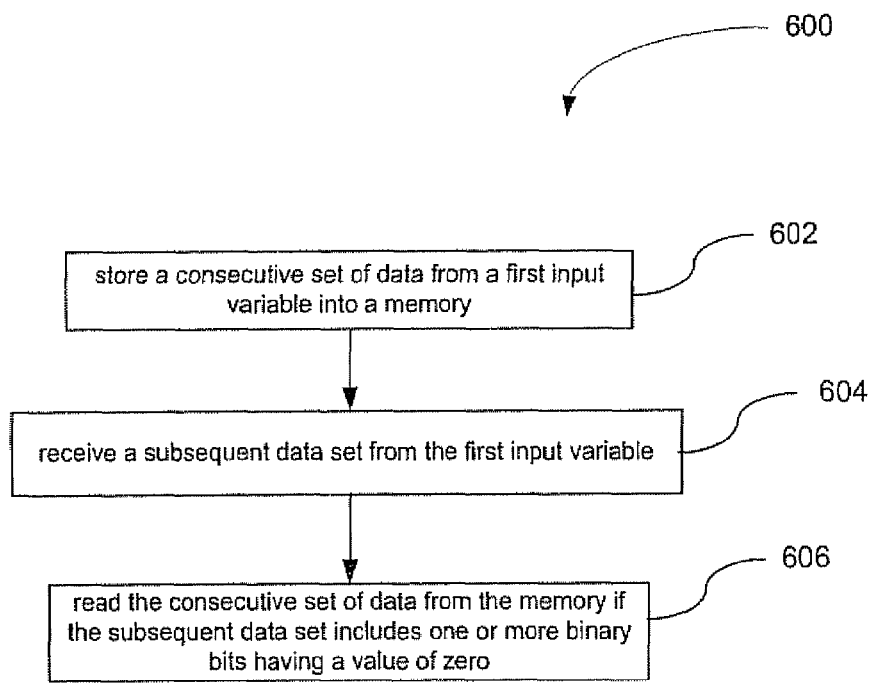
FIG. 6 illustrates yet another process for code normalization and byte construction.

FIG. 6 illustrates yet another process 600 for code normalization and byte construction. At a process block 602, the process 600 stores a consecutive set of data from a first input variable into a memory. Further, at a process block 604, the process 600 receives a subsequent data set from the first input variable. In addition, at a process block 606, the process 600 reads the consecutive set of data from the memory if the subsequent data set includes one or more binary bits having a value of zero.

Figure 7:
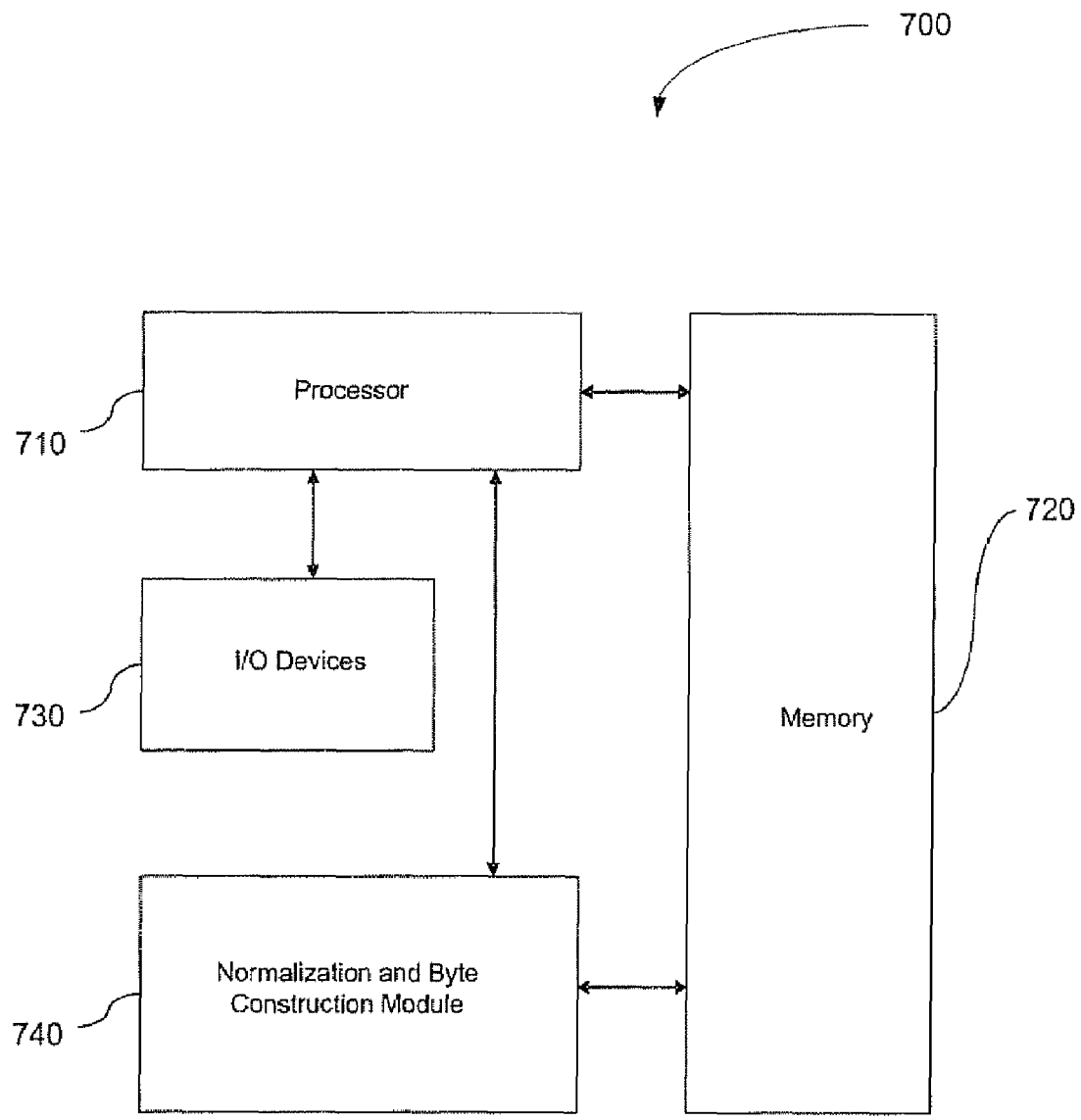
FIG. 7 illustrates a block diagram of a station or system that implements a code normalizer and byte construction engine.

FIG. 7 illustrates a block diagram of a station or system 700 that implements a code normalizer and byte construction engine. In one embodiment, the station or system 700 is implemented using a general purpose computer or any other hardware equivalents. Thus, the station or system 700 comprises a processor ("CPU") 710, a memory 720, e.g., random access memory ("RAM") and/or read only memory (ROM), a normalization and byte construction module 740, and various input/output devices 730, (e.g., storage devices, including but not limited to, a tape drive, a floppy drive, a hard disk drive or a compact disk drive, a receiver, a transmitter, a speaker, a display, an image capturing sensor, e.g., those used in a digital still camera or digital video camera, a clock, an output port, a user input device (such as a keyboard, a keypad, a mouse, and the like, or a microphone for capturing speech commands)).

It should be understood that the code normalization and byte construction module 740 may be implemented as one or more physical devices that are coupled to the CPU 710 through a communication channel. Alternatively, the normalization and byte construction module 740 may be represented by one or more software applications (or even a combination of software and hardware, e.g., using application specific integrated circuits (ASIC)), where the software is loaded from a storage medium, (e.g., a magnetic or optical drive or diskette) and operated by the CPU in the memory 720 of the computer. As such, the normalization and byte construction module 740 (including associated data structures) of the present invention may be stored on a computer readable medium, e.g., RAM memory, magnetic or optical drive or diskette and the like.

It is understood that the normalization and byte construction engine described herein may also be applied in other type of encoders. Those skilled in the art will appreciate that the various adaptations and modifications of the embodiments of this method and apparatus may be configured without departing from the scope and spirit of the present method and system. Therefore, it is to be understood that, within the scope of the appended claims, the present method and apparatus may be practiced other than as specifically described herein.

I claim:

1. A method comprising:
    extracting a plurality of subsets of bits from a first input, each of the subsets of bits having a bit width equaling a number of leading zeros from a second input variable;
    storing, in a memory, a consecutive sequence of the plurality of subsets; and
    reading the consecutive sequence of the plurality of subsets from the memory if a third input release flag is established.

2. The method of claim 1, wherein the consecutive sequence of the plurality of subsets is read from the memory in the same order that the consecutive sequence of the plurality of subsets is stored in the memory.

3. The method of claim 1, wherein each of the plurality of subsets of bits has a variable length.

4. The method of claim 3, further comprising concatenating the plurality of subsets of bits to form a stream of bits.

5. The method of claim 4, further comprising sending the stream of bits in a plurality of constant width blocks.

6. The method of claim 5, further comprising storing remaining bits that do not completely fill the constant width blocks in the plurality of constant width blocks as a subset of bits for a next set of input data.

7. The method of claim 5, wherein each of the subset of bits from the first input is formed by removing the most significant bit of the first input and continuing to remove the least significant bits of the input until the remaining bits are equal to the number of leading zeros from the second input variable.

8. The method of claim 1, wherein the third input release flag is the most significant bit of the first input.

9. The method of claim 1, further wherein the memory utilizes an array data structure for storage.

10. A method comprising,
storing a consecutive set of variable bit width data into a first in first out buffer, the variable bit width data having a width that is determined by a number of leading zeroes from an input variable; and
reading the data from the first in first out buffer if the receiving data contains only ones.

11. The method of claim 10, further comprising concatenating the variable length blocks of data to form a stream of bits.

12. The method of claim 11, further comprising sending the stream of bits in constant bit width blocks.

13. The method of claim 12, further comprising storing remaining bits that do not completely fill the constant width blocks as the first variable block width data for a next set of input data.

14. A method comprising:
storing a consecutive set of data from a first input variable into a memory;
receiving a subsequent data set from the first input variable; and
reading the consecutive set of data from the memory if the subsequent data set includes one or more binary bits having a value of zero.

15. The method of claim 14, further comprising reading the consecutive set of data from the memory if the most significant bit of the subsequent data set equals one.

16. The method of claim 15, further comprising determining a data set to store in the first input variable after the reading has completed based on data that causes a condition to be met so that the reading is initiated.

17. The method of claim 14, wherein the first input variable stores data having a variable bit width.

18. The method of claim 17, wherein variable bit width data has a width that is determined by a number of leading zeroes from a second input variable.

19. The method of claim 14, further comprising adding an input carry flag to the consecutive set of data if the subsequent data set includes one or more bits having a value of zero.

20. The method of claim 19, further comprising adding a carry bit of the consecutive set of data to the subsequent data set.

* * * * *